United States Patent
Iwami et al.

(10) Patent No.: US 8,015,465 B2
(45) Date of Patent: Sep. 6, 2011

(54) SCAN CONTROL METHOD AND DEVICE

(75) Inventors: Yoshikazu Iwami, Kawasaki (JP);
Takayuki Kinoshita, Kawasaki (JP);
Hidekazu Osano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 233 days.

(21) Appl. No.: 12/370,196

(22) Filed: Feb. 12, 2009

(65) Prior Publication Data

US 2009/0249145 A1    Oct. 1, 2009

(30) Foreign Application Priority Data

Mar. 28, 2008    (JP) ................................. 2008-086844

(51) Int. Cl.
*G01R 31/28* (2006.01)
(52) U.S. Cl. .......................... 714/729; 714/726; 714/727
(58) Field of Classification Search .................. None
See application file for complete search history.

(56) References Cited

U.S. PATENT DOCUMENTS

| | | | | |
|---|---|---|---|---|
| 5,270,642 | A * | 12/1993 | Parker | 714/727 |
| 6,018,815 | A | 1/2000 | Baeg | |
| 6,813,739 | B1 * | 11/2004 | Grannis, III | 714/729 |
| 6,988,232 | B2 * | 1/2006 | Ricchetti et al. | 714/736 |
| 7,412,637 | B2 * | 8/2008 | Wang et al. | 714/729 |
| 2005/0240850 | A1 | 10/2005 | Ohwada et al. | |
| 2009/0158105 | A1 * | 6/2009 | Konda et al. | 714/729 |

FOREIGN PATENT DOCUMENTS

| | | |
|---|---|---|
| EP | 0 651 261 A2 | 9/1994 |
| JP | 11-17126 | 7/1999 |
| JP | 2005-309867 | 11/2005 |
| WO | 99/14611 | 3/1999 |

OTHER PUBLICATIONS

Seongmoon Wang; Wenlong Wei; Cost Efficient Methods to Improve Performance of Broadcast Scan, Asian Test Symposium, 2008. ATS '08. 17th Digital Object Identifier: 10.1109/ATS.2008.72 Publication Year: 2008, pp. 163-169.*
Kuen-Jong Lee; Jih-Jeen Chen; Cheng-Hua Huang; Broadcasting test patterns to multiple circuits, IEEE Transactions on vol. 18, Issue: 12, 1999, pp. 1-10.*
European Search Report mailed Jul. 14, 2009 and issued in corresponding European Patent Application 09153461.0.

* cited by examiner

*Primary Examiner* — Jeffrey A Gaffin
*Assistant Examiner* — Guerrier Merant
(74) *Attorney, Agent, or Firm* — Staas & Halsey LLP

(57) ABSTRACT

A scan control method of a circuit device including setting information indicating scan mode in a register is provided. The scan control method includes cutting an output of scan-out data to a test access port controller and an input of scan-in data from a data register based on information set in the register, and controlling a connection between a scan register and a data register. Each data/scan register includes data registers for the same number of chains to be scanned at the same time. Data set in one data register may be kept in all the data registers in parallel and scanned in all the scan chains in a scan-in process in the broadcast mode. The data set in the data register may be kept in the data register corresponding to the scan register and scanned in the corresponding scan chain, in a scan-in process in the parallel mode.

8 Claims, 14 Drawing Sheets

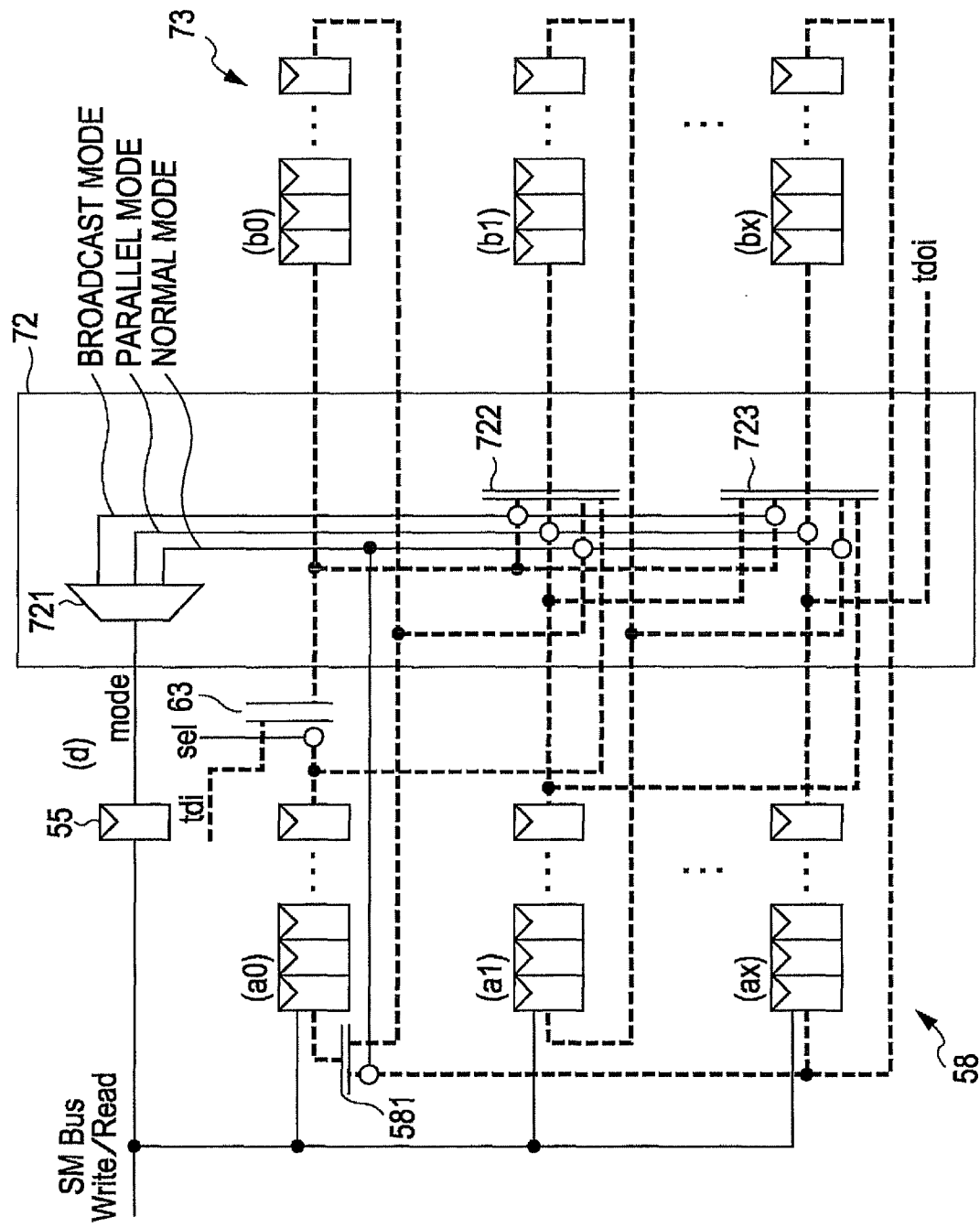

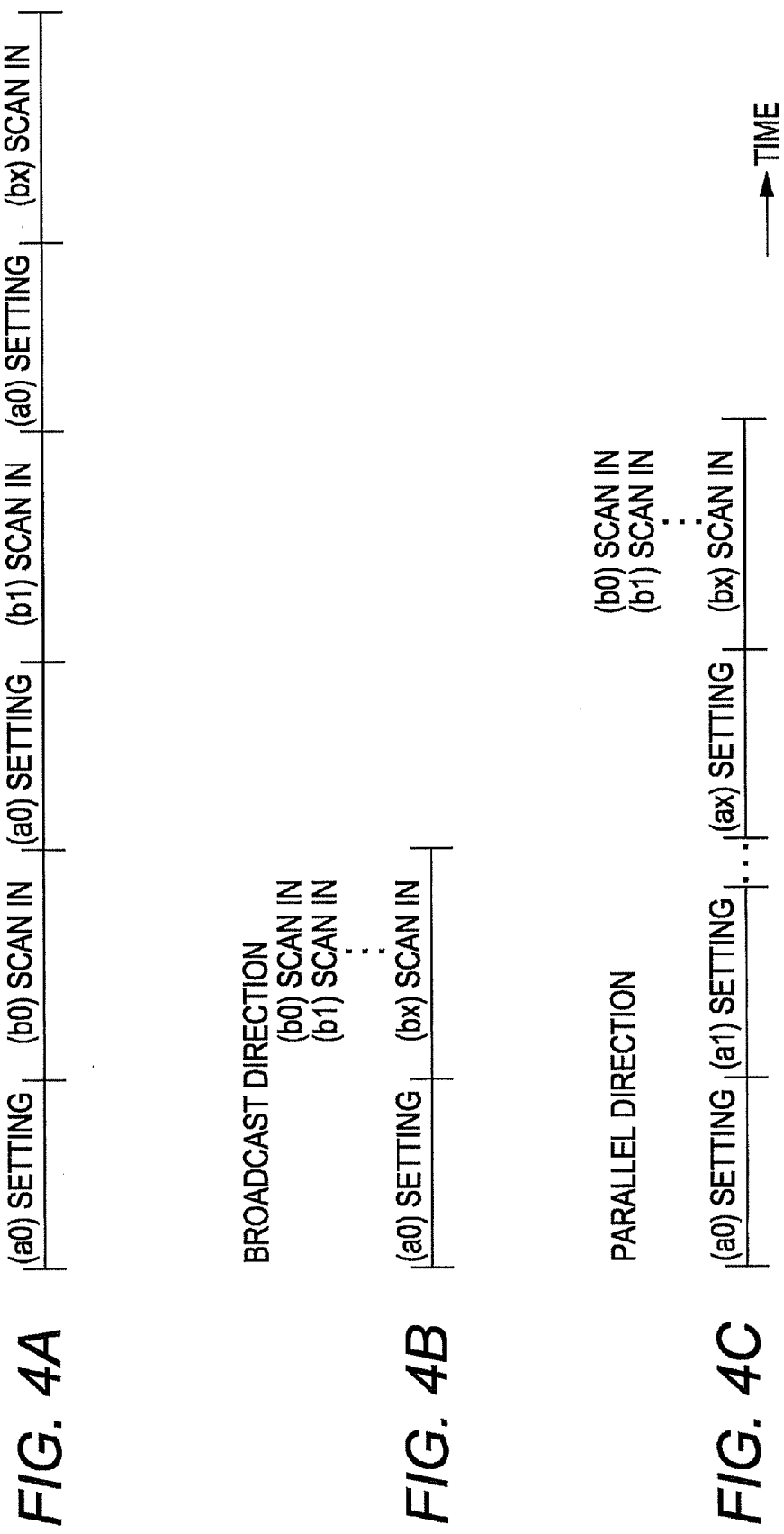

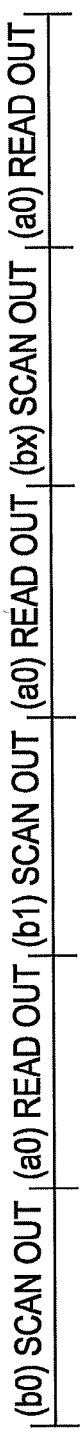

FIG. 7

| state | sm_tms | sm_trst |
|---|---|---|
| start | 0 | 0 |
| idle | 0 | 0 |
| dr | 1 | 0 |
| ir0 | 1 | 0 |
| ir1 | 1 | 0 |
| capture | 0 | 0 |
| shift | 0 | 0 |
| exit1 | 1 | 0 |
| pause | 0 | 0 |
| exit2 | 1 | 0 |
| update | 1 | 0 |
| restart | 0 | 0 |
| trst | 0 | 1 |
| mrst | 1 | 0 |
| stop | 0 | 0 |

SCAN CONTROL METHOD AND DEVICE

CROSS-REFERENCE TO RELATED APPLICATION

This application is related to and claims priority to the prior Japanese patent application having application number 2008-86844, filed Mar. 28, 2008 and incorporated by reference herein.

FIELD

The embodiments discussed herein are directed to a scan control method and a device.

BACKGROUND

A JTAG (Joint Test Action Group) bus (or a JTAG interface) connected to an LSI device may be mounted on a system as a board, a unit or a module with a large scale integrated circuit (LSI) device or a chip mounted thereon. The JTAG bus may be used for performing a test of the LSI device. The JTAG bus is a serial bus and may conform to a global standard such as IEEE1149.1, which enables a test of an LSI device at the test time other than the time of operating a system by providing an access to the LSI device from an external tester for performing a boundary scan on the LSI device.

On the other hand, there are some LSI devices including an I2C (Inter-integrated Circuit) bus (or an I2C interface) and an SM Bus (System Management Bus) (or SM Bus interface) connected, in the LSI device group such as a device, a chip set or a central processing unit (CPU) used for a system. The I2C bus and the SM Bus may be used when performing various controls in the system at the operating time. One system may have an LSI device connected to the JTAG bus, and another r LSI device connected to the I2C bus or the SM Bus. In other words, such system may include a mixture of LSI devices connected to different types or standards of buses and one LSI device may be connected to the different types (or standards) of the buses. The I2C bus and the SM Bus are general communication buses between devices or chips. The I2C bus and the SM Bus are serial buses of two wires including a clock signal wire and a data signal wire and the device connected to the serial bus has its specific address. By use of this address, the devices may communicate with each other through the I2C bus and the SM Bus.

In scanning a command register and a data register in the LSI device at a time of operating a system, only one chain or one path carrying out the scan at once may exist. Therefore, scanning of the LSI device for the number of times corresponding to the product of the number of chains and the number of latches may be necessary in collecting a plurality of chain settings and logs. In a uni-chain mode of connecting internal chains in a series, performing of a scan for the number of latches may be necessary. In collecting a plurality of chain settings and logs, the number of the times of scanning the LSI device increases, thus increasing the scan time required for scanning.

Conventionally, a e method of scanning a circuit such as the LSI device includes that at a time of operating a system, since a collection of a plurality of chain settings and logs may be necessary in starting up the system at the power-on, collecting logs, and changing the mode of the system. Thus, the necessary number of the times of scanning the LSI device increases enormously. Therefore, it has been hitherto difficult to shorten the scan time, the time for starting up a system, the time for collecting logs, and the time for changing a mode.

SUMMARY

It is an aspect of the embodiments discussed herein to provide a scan control method and device which can shorten the scan time required for scanning a circuit device necessary for operating a system.

The above aspects can be attained by a scan control method of a circuit device, connected with a bus, having a test access port controller, including setting information indicating one scan mode of a broadcast mode, a parallel mode, and a normal mode in a register unit; and cutting an output of scan out data to the test access port controller and an input of scan in data from a data register unit based on the information set in the register unit and controlling a connection between a scan register unit and the data register unit, wherein each of the data register unit and the scan register unit includes data registers for the same number of chains to be scanned at the same time, data set in one data register of the data register unit is kept in all the data registers of the scan register unit in parallel and scanned in all the scan chains in a scan in of the broadcast mode at a time of controlling the scan register unit and the data register unit, and the data set in the data register of the data register unit is kept in the data register corresponding to the scan register unit and scanned in the corresponding scan chain, in a scan in of the parallel mode.

These together with other aspects and advantages which will be subsequently apparent, reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

FIG. 3 illustrates an operation of a scan chain rearrangement unit.

FIGS. 4A, 4B, and 4C illustrate scan-in process.

FIGS. 5A and 5B illustrate scan-out process.

FIG. 7 illustrates a relation among an operation state of TAPC, a test mode select signal, and a test reset signal.

DESCRIPTION OF EMBODIMENTS

According to an aspect of an exemplary scan control method and device, information indicating one scan mode of a broadcast mode, a parallel mode, and a normal mode may be set in a register unit through a bus when controlling a scan of a circuit device having a test access port controller connected to the bus. Based on the information set in the register unit, a scan chain rearrangement unit of a circuit device may cut the output of scan out data to a test access port controller and the input of scan in data from a data register unit, and control a connection between its controlled scan register unit and data register unit. The data register unit and the scan register unit respectively have data registers for the number of the same chains that may be scanned at once.

In the scan-in operation in the broadcast mode, a connection between the scan register unit and the data register unit may be controlled so that the data set in one data register of the data register unit may be kept in all the data registers of the scan register unit in parallel to be scanned in all the scan chains. On the other hand, in the scan-in operation in the parallel mode, the connection between the scan register unit and the data register unit is controlled so that the data set in the data register of the data register unit may be kept in the data register corresponding to the scan register unit to be scanned in the corresponding scan chain.

In the scan-in operation in the broadcast mode and the parallel mode, the scan time may be shortened compared with the conventional technique.

Figure 1:
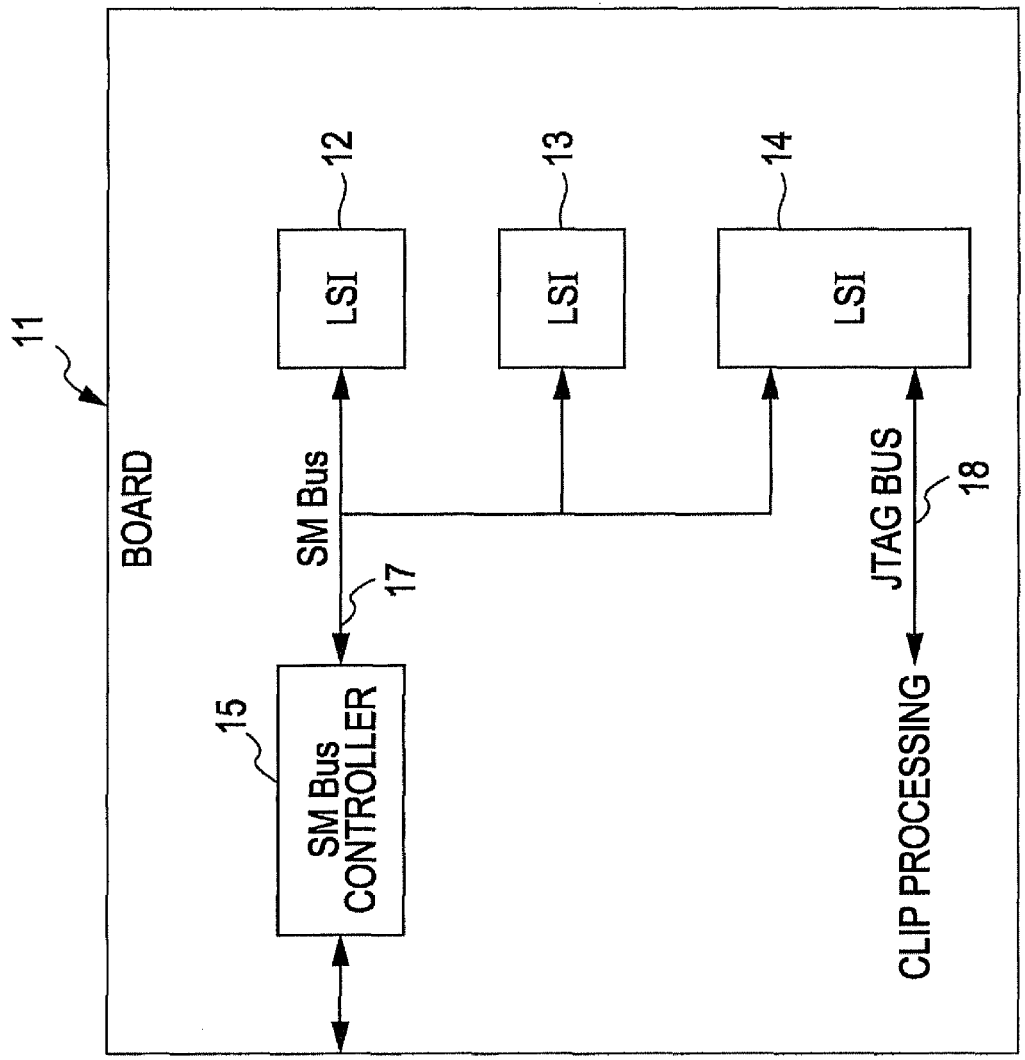
FIG. 1 illustrates an example of a board having mixture of LSI devices connected to different types of buses.

FIG. 1 illustrates a board 11 according to an exemplary embodiment. The board 11 includes LSI devices 12, 13, and 14 and an SM Bus controller 15. The SM Bus controller 15 and the LSI devices 12, 13, and 14 may be connected with each other through an SM Bus (or an SM Bus interface) 17. A JTAG bus (or a JTAG interface) 19 may be connected to the LSI device 14. Namely, both the SM Bus 17 and the JTAG bus 18 are connected to the LSI device 14. The SM Bus controller 15 is provided for the SM Bus 17 and can be connected to the outside of the board 11. The JTAG bus 18 can be connected to the outside of the board 11 through clip processing for directly connecting a clip to a terminal on the board 11. In using the I2C bus instead of the SM Bus 17, the I2C bus controller may be used instead of the SM Bus controller 15. The JTAG bus controller (not illustrated) for the JTAG bus 18 connected to the JTAG bus 18 may be provided in the board 11.

The LSI device 14 includes a scan control circuit, which enables internal setting of the LSI device 14 through the SM Bus 17 using the scan function. In other words, the scan control circuit realizes a mechanism for controlling the scan function from the interface such as the SM Bus 17. The JTAG bus 18 may be used as an element for filling test requirements, and is not used at a time of operating the board 11. A system controlling interface used at the operation time of the board 11 is integrated into the SM Bus 17. A main control of the scan function corresponding to the JTAG bus 18 is to control the test access port controller (TAPC) set in the LSI device 14, and the scan function is realized by controlling the TAPC not corresponding to the JTAG bus 18 but corresponding to the SM Bus 17.

Figure 2:
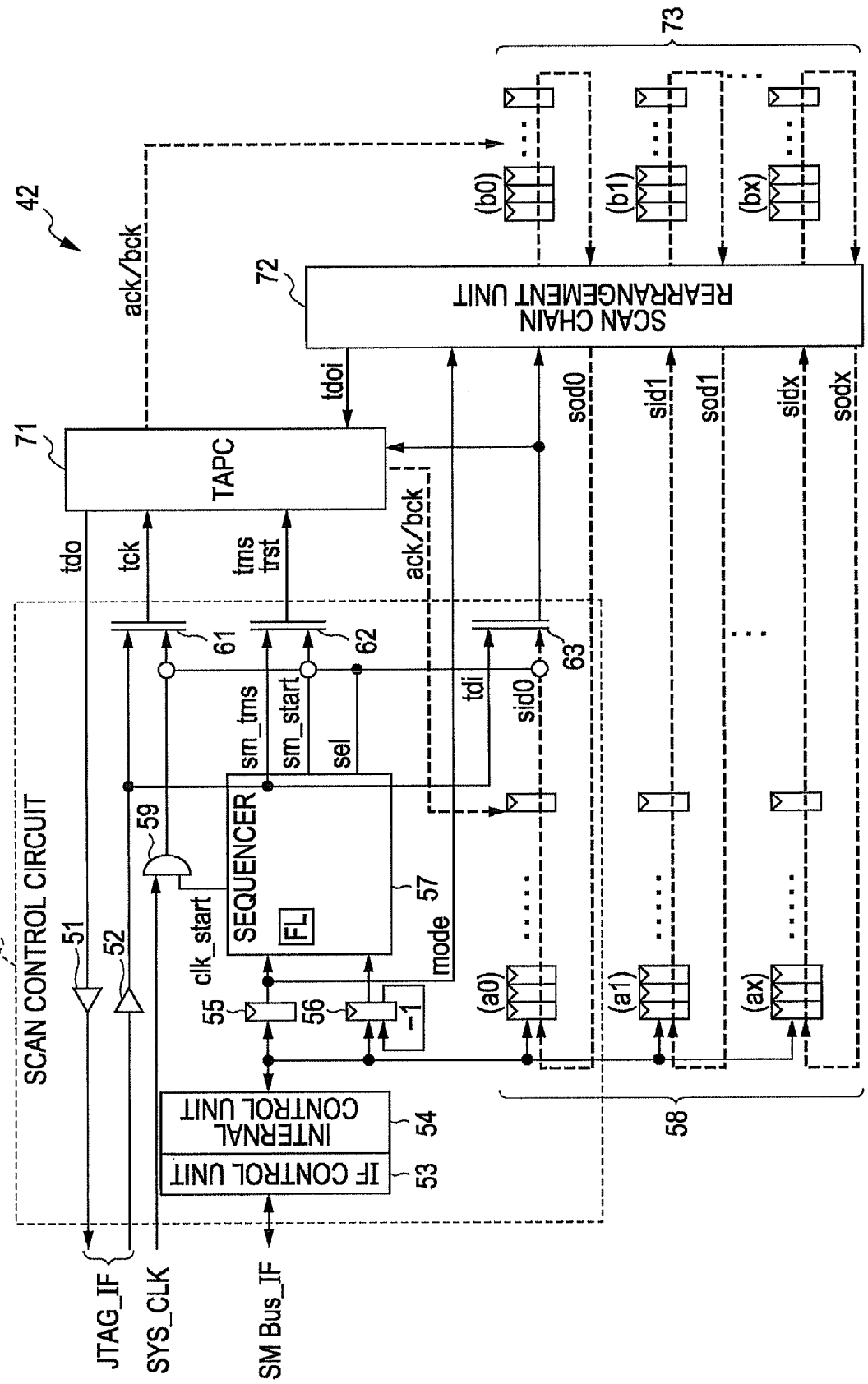
FIG. 2 illustrates a scan control circuit.

For the sake of brevity, FIG. 2 omits the illustration of clock.

The board, in other words, a bus used as a system controlling interface at the operation time of a system is not restricted to the SM Bus, but the I2C bus or other types of bus can be used. The board, in other words, a bus not used at the operation time of a system but used as an element for filling the test requirements is not restricted to the JTAG bus.

FIG. 2 illustrates a scan control circuit of an embodiment. For the sake of description, the bus used as the system controlling interface is the SM Bus, and that the bus used for filling the test requirements is the JTAG bus. Therefore, a scan control circuit 41 illustrated in FIG. 2 is included in the LSI device 14 in. 1.

In FIG. 2, "JTAG_IF" illustrates a signal transferred on the JTAG bus 18, and the "JTAG_IF" includes "TCK", "TMS", "TRST", "TDI", and "TDO". The signal "TCK" is a test clock to be input to the scan control circuit 41. The signal "TMS" is a test mode signal showing a test mode to be input to the scan control circuit 41. The signal "TAPC" described later operates in reply to the test mode signal TMS in synchronization with the test clock TCK. The signal "TRST" is a test reset signal to be input to the scan control circuit 41. The signal "TDI" is test data input to be input into the scan control circuit 41. The signal "TDO" is test data output to be supplied from the scan control circuit 41. The signal "SYS_CLK" illustrates a system controlling clock used on the system such as the board. The signal "SMBus_IF" illustrates the clock and the serial data transferred on the SM Bus 17 and includes "SMBCLK" and "SMBDT". The signal "SMBCLK" illustrates the SM Bus clock and the signal "SMBDT" illustrates the serial data transferred bidirectionally.

The scan control circuit 41 includes buffers 51 and 52, an interface (IF) control unit 53, an internal control unit 54, registers 55 and 56, a sequencer 57, a data register unit 58, an AND circuit 59, and selectors 61, 62, and 63, which are connected as shown in FIG. 2. The circuit unit 42 includes a TAPC 71, a scan chain rearrangement unit 72, and a scan register unit 73 which are connected as shown in FIG. 2. The scan register unit 73 includes data registers for the number of chains to be scanned at the same time for keeping data (b0) to (bx) described later, and each data register includes a plurality of flip flops (FF). The several data registers of the scan register unit 73 form a plurality of scan chains. The scan chain rearrangement unit 72 changes a combination of scan chains in the scan register unit 73 properly according to the necessity.

The scan control circuit 41 may be mounted within the LSI device or outside of the LSI device, while the TAPC 71 and the scan chain rearrangement unit 72 have to be mounted within the LSI device. The TAPC 71 and the scan chain rearrangement unit 72 are used for a test in the LSI device. Since the scan control circuit 41 forms the interface equivalent to the JTAG bus in the sequencer 57, when the scan control circuit 41 is mounted outside the LSI device, it may be connected to the JTAG bus 18.

In FIG. 2, the signal "sm_tms" is a test mode select signal generated by the sequencer 57. The test mode signal is the same signal as the test mode select signal "TMS". The signal "sm_trst" is a test reset signal generated by the sequencer 57. The signal "sel" is a switching signal (select signal) between "JTAG_IF" and "SMBus_IF" generated by the sequencer 57, and the signal "clk_start" is a clock start signal generated by the sequencer 57. The clock start signal "clk_start" is a signal for supplying the system clock "SYS_CLK" from the AND circuit 59 at a time of scanning (such scanning is called as "SM Bus scan" hereinafter) from a control of the SM Bus 17. The signal "tck" is a test clock obtained by the selector 61 selectively outputting the test clock "TCK" or the system clock "SYS_CLK". The signal "tms" is a test mode select signal obtained as the result that the selector 62 selectively outputs the test mode select signal "sm_tms", namely after the selection. The signal "trst" is a test reset signal obtained as the result that the selector 61 selectively outputs the test reset signal "sm_trst", namely after the selection. The signal "tdo" is a test data output which is received from the TAPC 71, and is supplied from the scan control circuit 41 as the test data output "TDO". The signal "tdi" is a test data input which is received from the JTAG bus 18 as the test data input "TDI", and is supplied from the scan control circuit 41 to the TAPC 71. The signal "tdoi" is scan out data supplied from the scan chain rearrangement unit 72 to the TAPC 71 at a time of "JTAG_IF" scan and the TAPC 71 supplies the test data output "tdo" based on the scan out data "tdoi". The signal "ack/bck" is a scan clock supplied from the TAPC 71 to the scan register unit 73 to be scanned by the scan chain rearrangement unit 72, more specifically to be supplied to a plurality of FFs forming the scan register unit 73. The scan clock "ack/bck" is also supplied from the TAPC 71 to the data register unit 58. The signal "sodx" is scan out data supplied from the scan chain rearrangement unit 72 to the data register unit 58 at a time of the SM Bus scan. The signal "sidx" is scan-in data supplied from the data register unit 58 to the scan chain rearrangement unit 72 through the selector 63 at a time of the SM Bus scan. The signal "mode" is a scan mode signal showing scan mode, one of the broadcast mode, the parallel mode, and the normal mode, described later, supplied from the SM Bus 17.

The switching signal "sel" generated by the sequencer 57 is supplied to the respective selectors 61, 62, and 63 for specifying the input to be selectively outputted from the respective selectors 61, 62, and 63. In FIG. 2, a white circle illustrates the input to be selectively supplied from each of the selectors 61, 62, and 63 by supplying the switching signal "sel" of an active signal level (for example, high level) to each of the selectors 61, 62, and 63.

In FIG. 2, when the clock and the serial data "SMBus_IF" are supplied from the SM Bus 17 to the IF control unit 53, the internal control unit 54 writes the instruction register mode or the internal chain (or the data register) mode (called as "IR/DR mode" hereinafter), a start bit, and the scan mode signal "mode" into the register 55, and writes the number of shifts in a scan into the register 56, by the register write operation. The start bit may be set on by the SM Bus 17 at a start of the scan. The IR mode specifies a scan of an instruction register in the LSI device having the circuit unit 42. The DR mode specifies a scan of a data register in the LSI device having the circuit unit 42. The register write operation to the registers 55 and 56 triggers the sequencer 57 to start the operation. The scan mode may be set on one of the broadcast mode, the parallel mode or the normal mode described later by entering the scan mode signal "mode" from the SM Bus 17 at a start of the scan.

Based on the IR/DR mode, the start bit, the scan mode signal "mode", and the number of shifts written in the registers 55 and 56, the sequencer 57 generates a sequence necessary for operating the scan function of the TAPC 71, and controls the TAPC 71 according to the test mode select signal "sm_tms" and the test reset signal "sm_trst". The TAPC 71 starts the scan based on the test mode select signal "sm_tms" and the test reset signal "sm_trst". The sequencer 57 manages a scan flag FL set on during the scan corresponding to the control of the SM Bus 17.

Based on the scan mode "mode" supplied from the register 55, the scan chain rearrangement unit 72 cuts the output of the scan out data "tdoi" to the TAPC 71 and the test data input "tdi" from the scan control circuit 41, in other words, the input of the scan in data, and makes a connection with the data register unit 58.

In FIG. 2, the data register unit 58 includes data registers for keeping the data (a0) to (ax) and for the number of chains to be scanned at the same time. Here, x is the natural number of 2 or more. The data (a0) may be used in the respective scan modes of the broadcast mode, the parallel mode, and the normal mode. In the scan-in operation in the broadcast mode, the data (a0) set in one data register of the data register unit 58 is kept in all the data registers of the scan register unit 73 in parallel and scanned in all the scan chains. When the LSI device 14 includes a cross-bar, since a setting register common in each port exists, the broadcast mode is effective in the case of setting the same data value. In the scan-in of the parallel mode, the data (a0), (a1), . . . , and (ax) set in the data registers of the data register unit 58 are kept in the corresponding data registers of the scan register unit 73 in parallel and scanned in the corresponding scan chain. Even when the LSI device 14 includes the cross-bar, there is the case where the data values different in every port are set in the setting register and the parallel mode is effective in such a case. The scan-out operation may be performed in the parallel mode and the data of each scan chain is collected at the same time by reading the data of each data register of the scan register unit 73, to read out to the corresponding data register of the data register unit 58.

The normal mode is a scan mode in which only the data (a0) set in one data register of the data register unit 58 is kept in each data register of the scan register unit 73 one by one, and all the scan chains are scanned one after another.

FIG. 3 illustrates an exemplary operation of the scan chain rearrangement unit 72. A selector 581 connected as shown in FIG. 3 is provided in the data register unit 58. The scan chain rearrangement unit 72 includes a decoder 721 and selectors 722 and 723 connected as shown in FIG. 3. The decoder 721 decodes the scan mode signal "mode" and supplies the decoded result showing which scan mode of the broadcast mode, the parallel mode, and the normal mode the scan mode signal "mode" indicates, to the selectors 722 and 723. The decoder 721 supplies the decoded result to the selector 581 of the data register unit 58 when the scan mode is the normal mode.

The selector 63 switches between the test data input "tdi" from the sequencer 57 and the data (a0) from the data register unit 58 based on the switching signal "sel". At a time of the test using the "JTAG_IF", the test data "tdi" is supplied to the scan chain rearrangement unit 72, and at a time of the scan using the "SMBus_IF", the data (a0) is supplied to the scan chain rearrangement unit 72.

When the decoded result illustrates the broadcast mode, the selector 722 outputs the data (a0) from the data register unit 58. When the decoded result illustrates the parallel mode, the selector outputs the data (a1) from the data register unit 58. When the decoded result illustrates the normal mode, the selector 722 outputs the data (b0) from the scan register unit 73. When the decoded result shows the other scan mode, the selector 723 outputs the data (a0) from the data register unit 58, regarded as being at the test time.

When the decoded result shows the broadcast mode, the selector 723 outputs the data (a0) from the data register unit 58. When the decoded result shows the parallel mode, the selector outputs the data (ax) from the data register unit 58. When the decoded result shows the normal mode, the selector 723 outputs the data (b1) from the scan register unit 73. When the decoded result shows the other scan mode, the selector 723 outputs the data (a1) from the data register unit 58, regarded as being at the test time.

FIGS. 4A, 4B, and 4C illustrate the scan-in operation. FIG. 4A illustrates the scan-in operation at a time of the normal mode, FIG. 4B illustrates the scan-in operation at a time of the broadcast mode, and FIG. 4C illustrates the scan-in operation at a time of the parallel mode. As illustrated, in the normal mode of FIG. 4A, the process may be performed in the order of the setting of the data (a1), the scan-in of the data (b0), the scan-in of the data (a0), the setting of the data (a0), and the scan-in of the data (bx), and therefore, the scan time is comparatively long. While, in the broadcast mode in FIG. 4B, after the setting of the data (a0), the scan-in of the data (b0), (b1), . . . , and (bx) may be performed at the same time, hence to shorten the scan time extremely compared with the case of the normal mode. In the parallel mode of FIG. 4C, after the setting of data (a0), the data (a1), . . . , and the data (ax), the scan-in of the data (b0), (b1), . . . , and (bx) may be performed at the same time, hence to shorten the scan time compared with the case of the normal mode.

FIGS. 5A and 5B illustrate the scan-out operation. FIG. 5A illustrates the scan-out operation in the normal mode and FIG. 5B illustrates the scan-out operation in the parallel mode. In the normal mode of FIG. 5A, the processing may be performed in the order of the scan-out of the data (b0), the reading out of the data (a0), the scan-out of the data (b1), the reading out of the data (a0), . . . , the scan-out of the data (bx), and the reading out of the data (a0), and the scan time is comparatively long. While, in the parallel mode of FIG. 5B, after the scan-out of the data (b0), the data (b1), . . . , and the data (bx) may be performed at the same time, the reading out of the data (a0), the data (a1), . . . , the data (ax) may be performed, hence to shorten the scan time compared with the case of the normal mode.

Figure 6:
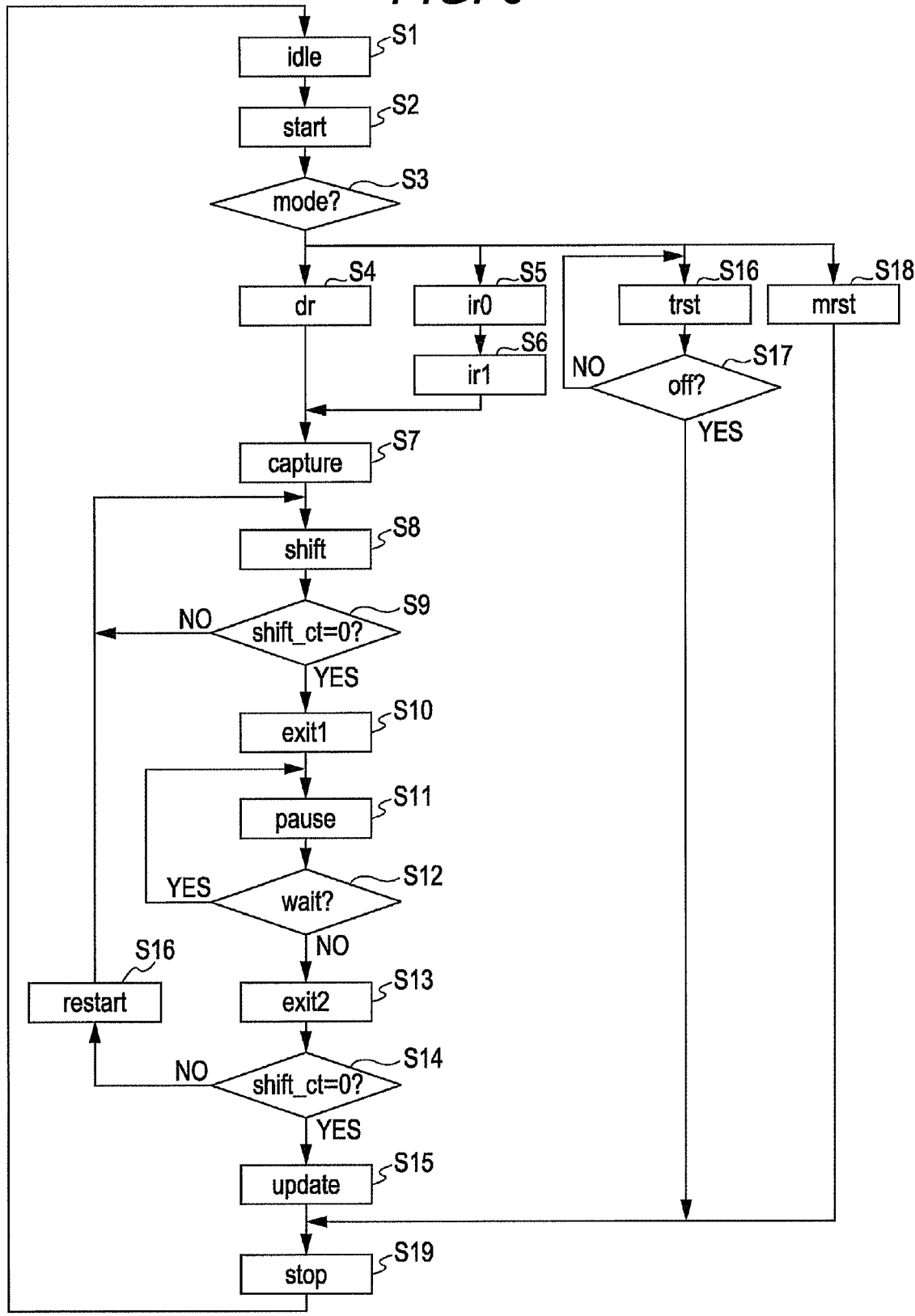
FIG. 6 illustrates an operation of a TAPC.

FIG. 6 illustrates the operation of the TAPC 71, corresponding to a state diagram. FIG. 7 illustrates a relation among the operation state "state" of the TAPC 71, the test mode select signal "sm_tms", and the test reset signal "sm_trst". The test mode select signal "sm_tms" and the test reset signal "sm_trst" having the logic values as shown in FIG. 7 are generated in each operation state shown in FIG. 6: "start", "idle", "dr", "ir0", "ir1", "capture", "shift", "exit1", "pause", "exit2", "update", "restart", "trst", "mrst" and "stop". For example, the logic value "0" indicates an inactive signal level (for example, low level), and the logic value "1" indicates an active signal level (for example, high level).

In FIG. 6, the operation state "state" of the TAPC 71 in S1 may be set at an idle state "idle", and in S2, the operation state "state" may be set at a start state "start". In S3, which of "dr", "ir0", "trst", and "mrst" the mode "mode" is indicating is judged. In the DR mode "dr" at which the operation mode "mode" may be set in S4, the data register is scanned. In the IR modes "ir0" and "ir1" set in S5 and S6, the instruction register is scanned.

Figure 8:
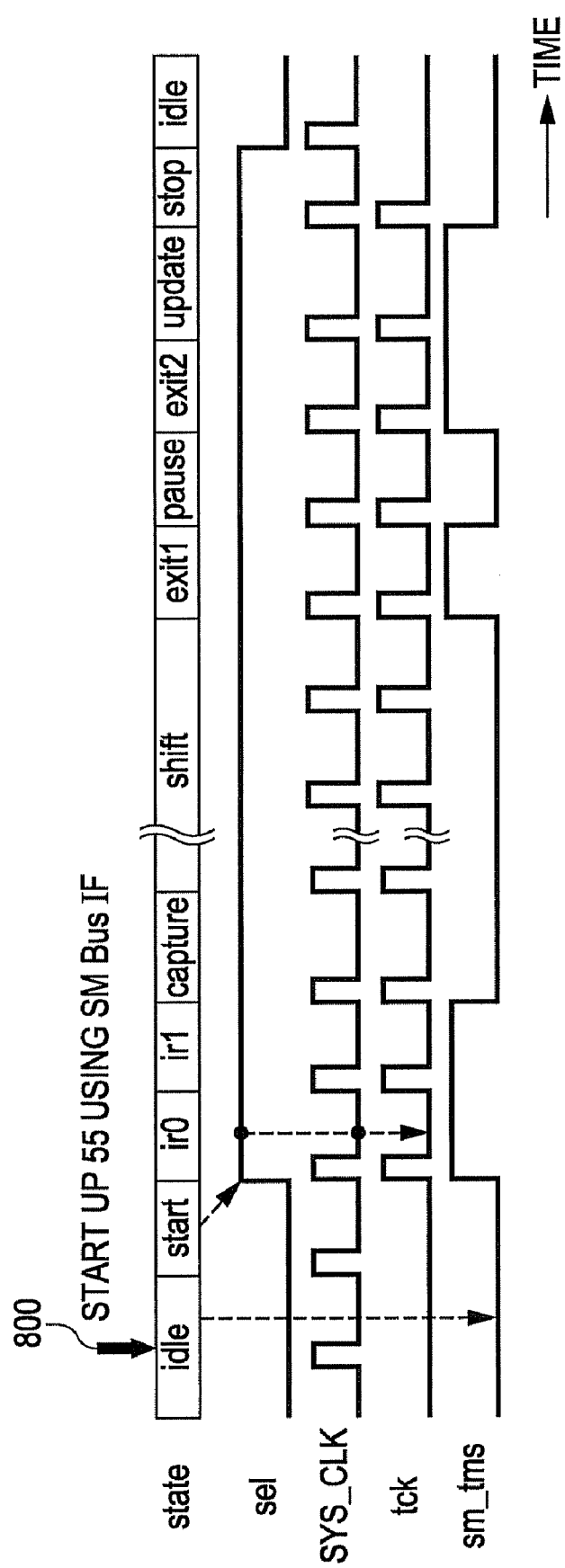
FIG. 8 illustrates an operation of a sequencer in an IR mode.
Figure 9:
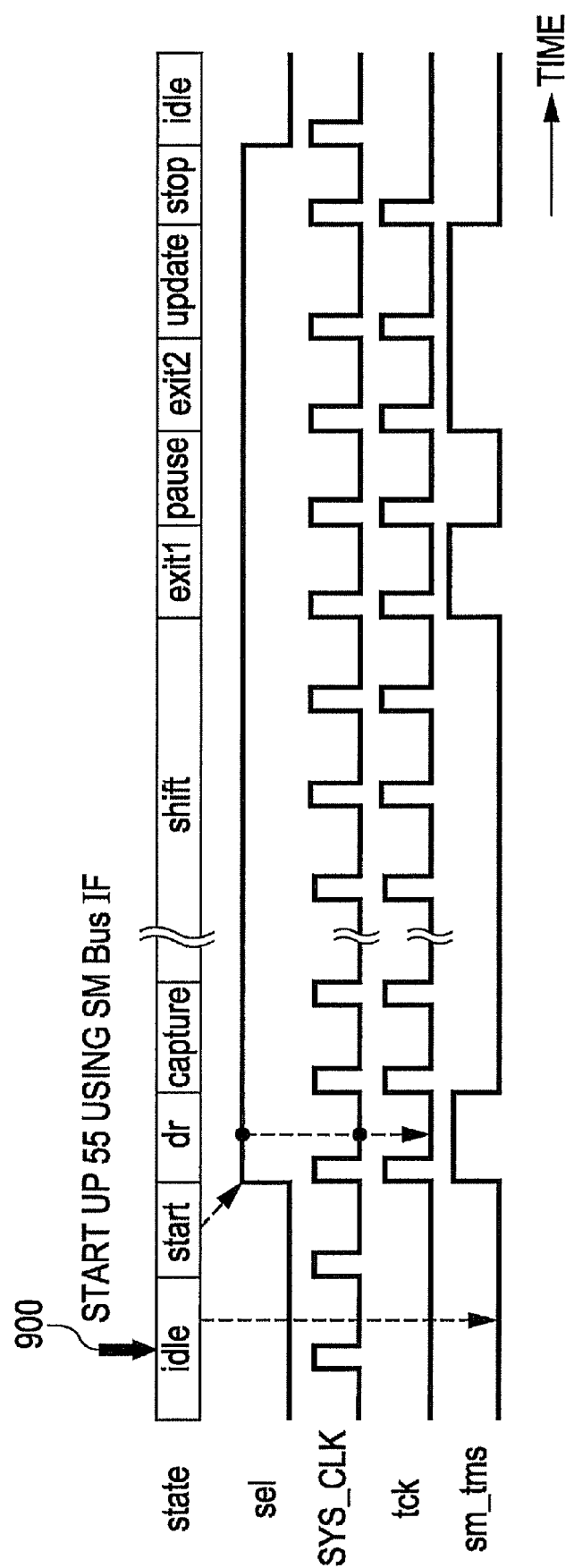
FIG. 9 illustrates an operation of a sequencer in a DR mode.

FIG. 8 illustrates the operation of the sequencer 57 in the IR mode. FIG. 9 illustrates the operation of the sequencer 57 in the DR mode. FIGS. 8, 9, and 10 to 12 illustrate operation state "state" of the TAPC 71, the switching signal "sel", the system clock "SYS_CLK", the test clock "tck", and the test mode select signal "sm_tms". In FIG. 8 a downward thick arrow 800, and in FIG. 9, a downward thick arrow 900 illustrate the startup of the register 55 using the clock and the serial data "SMBus_IF" from the SM Bus17.

In a capture mode "capture" set in S7, the scanned instruction or the scan data of the data register is loaded into the scan chain specified by the scan register unit 73. In the shift mode "shift" set in S8, a shift operation of shifting the instruction or the data of the register loaded into the scan chain is performed. In S9, whether the count of the shifts "shift_ct" is zero or not is checked. When the check result in S9 is NO, the process returns to S8. When the check result in S9 is YES, the process proceeds to S10.

In an exit mode "exit1" set in S10, the shift operation is stopped. In a pause mode "pause" set in S11, the shift operation is temporarily paused, into a waiting state. In S12, whether a predetermined time "wait" includes elapsed or not is checked. When the check result in S12 is YES, the process returns to S11. When the check result in S12 is NO, the process goes ahead to S13. In an exit mode "exit2" set in S13, the shift operation is paused. In S14, whether the count of the shifts "shift_ct" is zero or not is checked. When the check result in S14 is YES, the process goes ahead to S15. When the check result in S14 is NO, the process goes ahead to S16. In an update mode "update" set in S15, the shift operation is completed, to scan the next instruction register or update the data register, and the process goes ahead to S19 described later. In a restart mode "restart" set in S16, the shift operation is restarted and the process returns to S8.

Figure 10A:
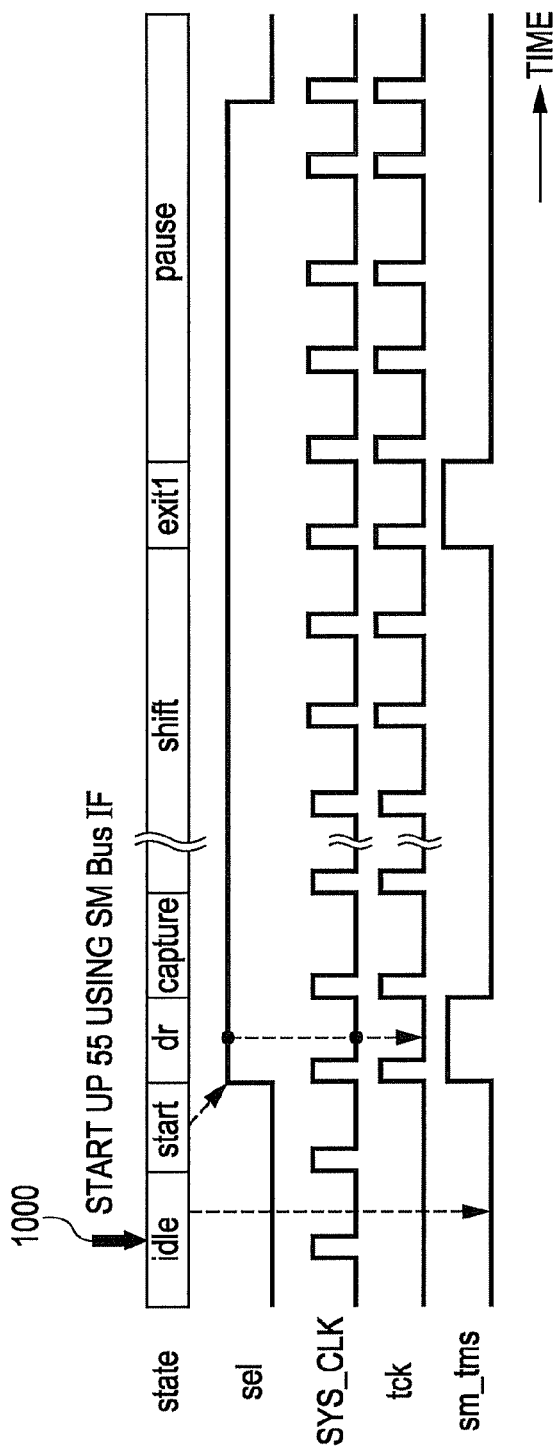
FIGS. 10A and 10B illustrate an operation of a sequencer in a restart mode.
Figure 10B:
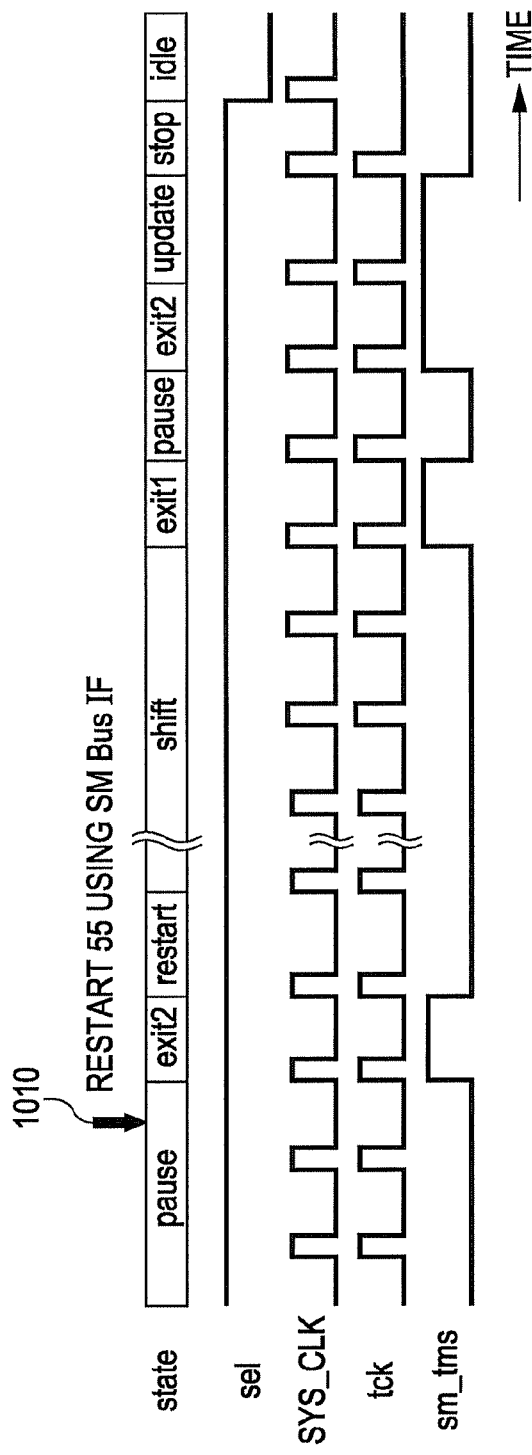

FIGS. 10A and 10B illustrate the operation of the sequencer 57 in the restart mode "restart". The timing of FIG. 10B follows the timing of FIG. 1A. The downward thick arrow 1000 shown in FIG. 10A indicate the startup of the register 55 using the clock and the serial data "SMBus_IF" from the SM Bus 17, and the downward thick arrow 1010 shown in FIG. 10B indicates the restart of the register 55 using the clock and the serial data "SMBus_IF" from the SM Bus 17.

In the test reset mode "trst" at which the operation mode "mode" may be set in S16, the TAPC and the test peripheral circuit are reset. In S17, whether the test is in an off mode "off" or not is checked. When the check result in S17 is NO, the process returns to S16. When the check result in S17 is YES, the process goes ahead to S19. In a manual reset mode "mrst" at which the operation mode "mode" may be set in S18, a state machine in the TAPC is reset manually and the process goes ahead to S19. The manual reset is specified by the SM Bus 17. In a stop mode "stop" set in S19, the operation of the sequencer 57 is paused and the process returns to S1.

Figure 11:
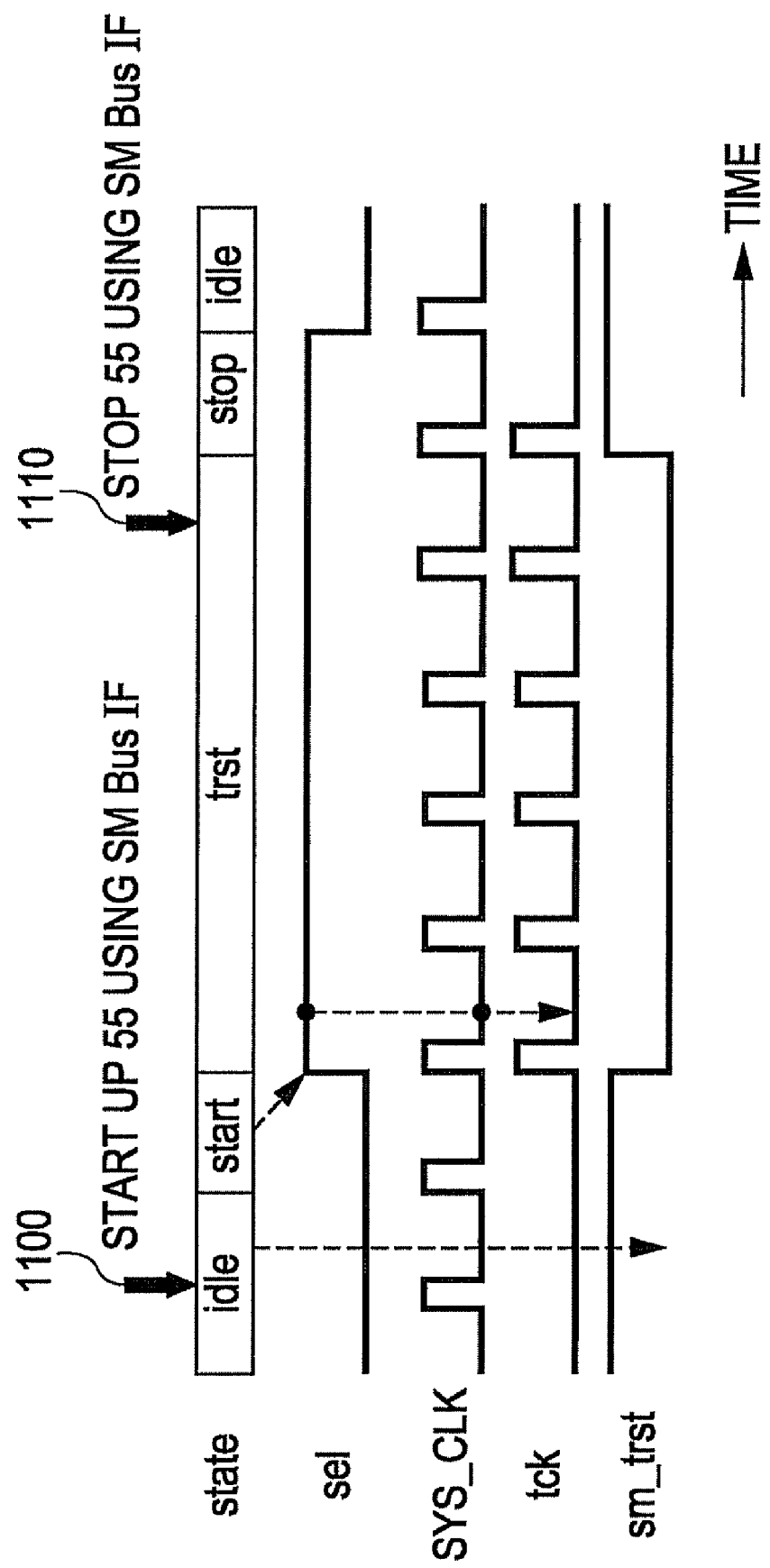
FIG. 11 illustrates an operation of a sequencer in a test reset mode.
Figure 12:
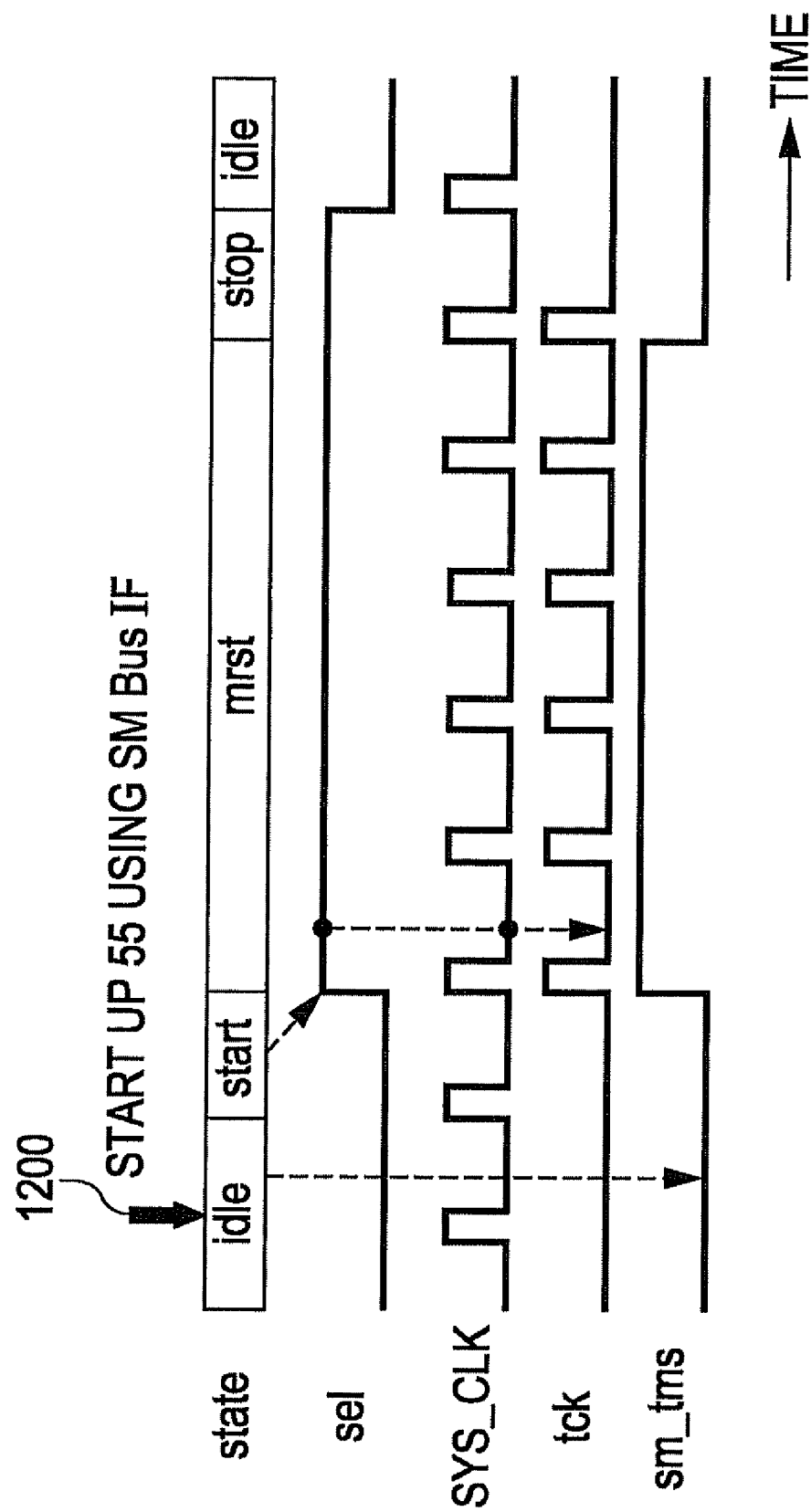
FIG. 12 illustrates an operation of a sequencer in a manual reset mode.

FIG. 11 illustrates the operation of the sequencer 57 in the test reset mode "trst". FIG. 12 illustrates the operation of the sequencer 57 in the manual reset mode "mrst". In FIG. 11, a downward thick arrow in the left side 1100 indicates the startup of the register 55 using the clock and the serial data "SMBus_IF" from the SM Bus 17, and the downward thick arrow in the right side 1110 indicates the stop of the register 55 using the clock and the serial data "SMBus_IF" from the SM Bus 17. In FIG. 12, the downward thick arrow 1200 indicates the startup of the register 55 using the clock and the serial data "SMBus_IF" from the SM Bus 17.

As described above, since the registers in the LSI device to be scanned are different between the IR mode and the DR mode in the TAPC 71, the scan control circuit 41 includes the register 55 for specifying either of the IR mode or the DR mode. The scan mode signal "mode" may be set in the register 55. The setting of the register 55 can be performed through the SM Bus 17. The sequencer 57 changes the sequence generated corresponding to the mode and the scan mode signal "mode" set in the register 55. Further, the scan control circuit 41 includes the register 56 for specifying the number of scan shifts. The setting of the register 56 can be performed through the SM Bus 17. The sequencer 57 judges the start and the end of shift generates a sequence according to the number of shifts set in the register 56.

The sequencer 57 generates the test mode select signal "sm_tms" and the test reset signal "sm_trst" based on the values set in the registers 55 and 56. The TAPC 71 determines the operation according to a change of the test mode select signal "tms" and the test reset signal "trst" and controls the scan. The JTAG bus 18 may be used only at the test time of the LSI devices 14, 14A, 24, 24A, and the signal "JTAG_IF" from the JTAG bus 18 is blocked by the selectors 61 to 63 not to be supplied to the TAPC 71 at a time of operating a system such as the boards 11 to 11-4.

The scan chain rearrangement unit 72 cuts the supply of the scan out data "tdoi" to the TAPC 71 and the scan-in data "tdi" from the scan control circuit 41, and makes a connection with the data register unit 58. The data register unit 58 is to set the scan-in data from the SM Bus 17 and perform the shift operation during the scan, and at a time of setting the scan-in data, the data register unit 58 can perform the write operation with the system clock "SYS_CLK" supplied. The supply of the system clock "SYS_CLK" to the data register unit 58 is stopped during the scan, and the shift operation during the scan is performed in reply to the scan clocks "ack" and "bck".

At a time of operating the system, the scan control circuit 41 may generate the test clock "tck" from the system clock "SYS_CLK". Taking the electric power consumption of the system into account, the test clock "tck" is supplied to the TAPC 71 during the period from just before the scan start to the scan end. When the scan is not performed, the scan control circuit 41 does not supply the test clock "tck" to the TAPC 71.

The "Register Write" and the "Register Read" toward the LSI device from the SM Bus 17 are performed by using the SMBus clock "SMBCLK" and the serial data "SMBDT" (in other words, "SMBus_IF") transferred on the SM Bus 17. In the register write operation, the IR mode or the DR mode are set and the scan mode signal "mode" is written in the register 55, the number of shifts may be set in the register 56, and the start bit "on" for starting the scan may be set in the register 55, hence to start the scan. In the register read operation, the polling for the scan flag FL managed in the sequencer 57 may be performed and after it is confirmed that the scan flag FL turned off and the scan includes been completed, the information set in the registers 55 and 56 is read and collected.

Figure 13:
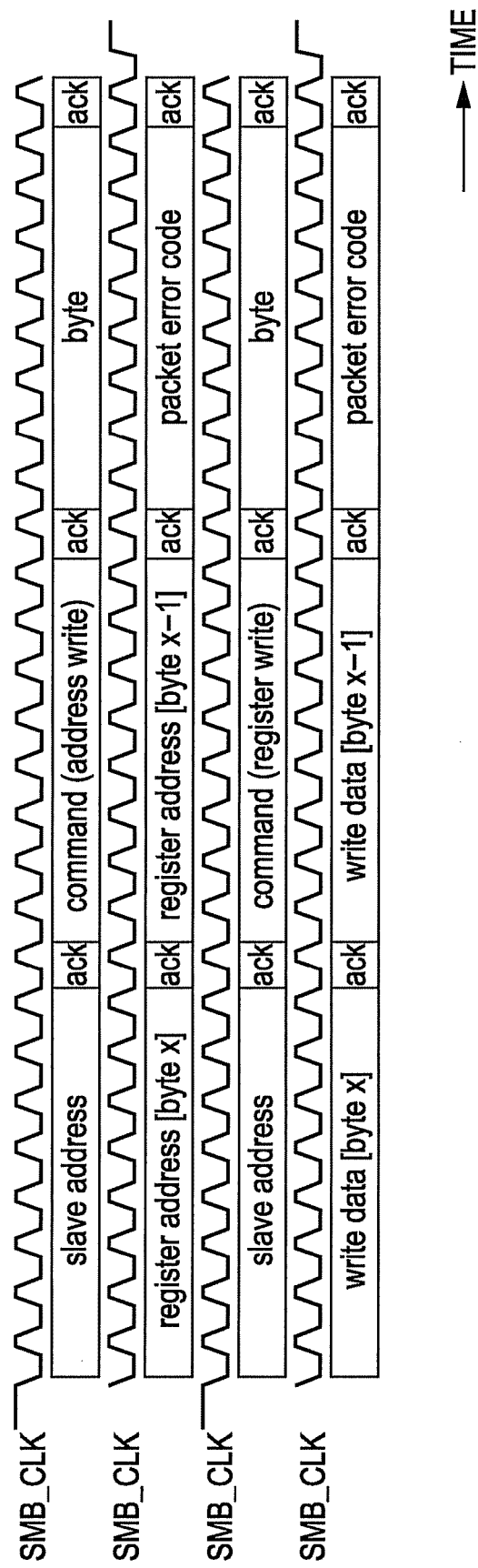
FIG. 13 illustrates a write operation with a SM Bus.
Figure 14:
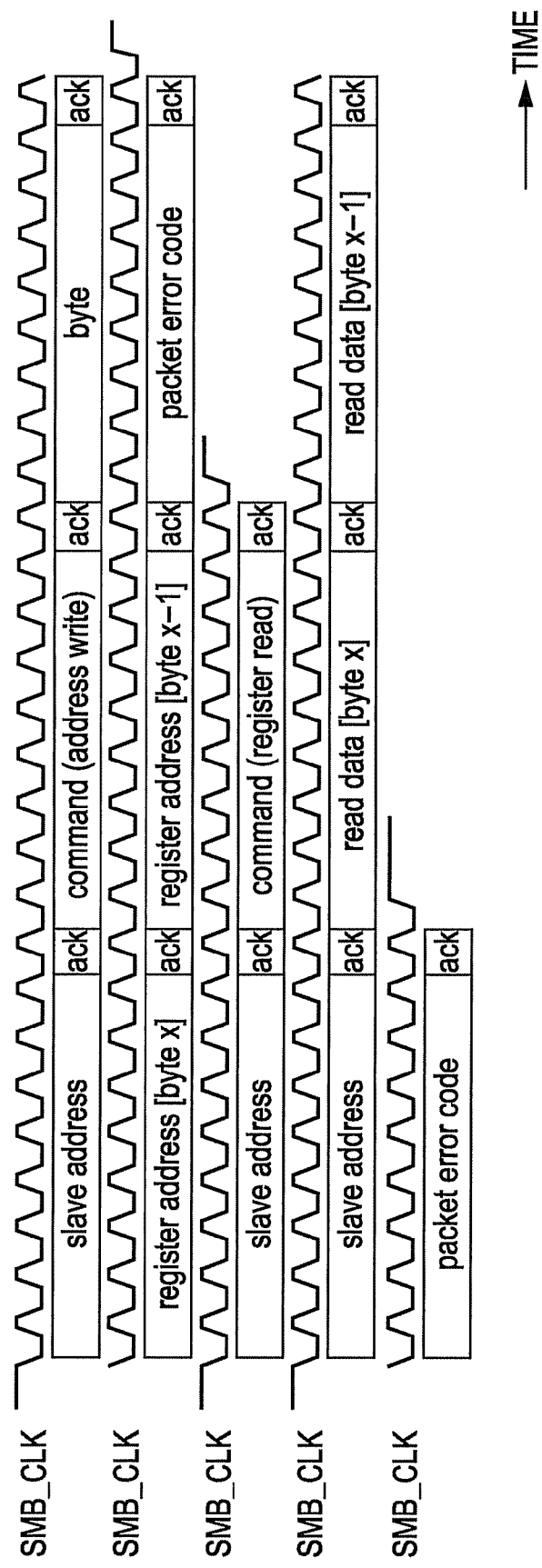
FIG. 14 illustrates a read operation with SM Bus.

FIG. 13 illustrates the write operation using the SM Bus. FIG. 14 illustrates the read operation using the SM Bus. In FIG. 13 and FIG. 14, "ack" represents response information to illustrate that the address, the command, the data have been received correctly, in other words, information returned from the LSI device is checked.

FIG. 13 illustrates an example of performing the write operation upon receipt of slave address, address write command, byte, register address of byte x, register address of byte x−1, packet error code, slave address, register write command, byte, write data of byte x, write data of byte x−1, and packet error code from the SM Bus 17 to the scan control circuit 42.

FIG. 14 illustrates an example of performing the read operation upon receipt of slave address, address write command, byte, register address of byte x, register address of byte x−1, packet error code, slave address, register read command, slave address, read data of byte x, read data of byte x−1, and packet error code from the SM Bus 17 to the scan control circuit 42.

According to an exemplary embodiment, the JTAG bus 18 for test is not used at a time of operating a system, namely at the system operation and the SM Bus 17 for a system control in its operation may be used to do the scan at a test time of the system. Therefore, mounting the JTAG controller for the exclusive use of the JTAG bus on the system may not be necessary. Further, mounting of a control program for both the SM Bus controller 15 and the JTAG controller on the system may not be necessary. Therefore, the system maybe produced at a comparatively low price. Further, a control of the whole system, that is, the system control can be integrated into the SM Bus 17 for a system control in its operation, which makes the system control easier. As the result, the whole system can be controlled comparatively easily.

The bus for test is not restricted to the JTAG bus. The bus for a system control in its operation is not restricted to the SM Bus and the I2C bus, but any bus that can perform the setting toward the registers 55 and 56 shown in FIG. 6 makes a good use of the scan function as mentioned above.

The embodiments can be implemented in computing hardware (computing apparatus) and/or software, such as (in a non-limiting example) any computer that can store, retrieve, process and/or output data and/or communicate with other computers. The results produced can be displayed on a display of the computing hardware. A program/software implementing the embodiments may be recorded on computer-readable media comprising computer-readable recording media. The program/software implementing the embodiments may also be transmitted over transmission communication media. Examples of the computer-readable recording media include a magnetic recording apparatus, an optical disk, a magneto-optical disk, and/or a semiconductor memory (for example, RAM, ROM, etc.). Examples of the magnetic recording apparatus include a hard disk device (HDD), a flexible disk (FD), and a magnetic tape (MT). Examples of the optical disk include a DVD (Digital Versatile Disc), a DVD-RAM, a CD-ROM (Compact Disc-Read Only Memory), and a CD-R (Recordable)/RW. An example of communication media includes a carrier-wave signal.

Further, according to an aspect of the embodiments, any combinations of the described features, functions and/or operations can be provided.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. A scan control method of a circuit device, connected with a bus, having a test access port controller, the method comprising:

setting information indicating one scan mode of a broadcast mode, a parallel mode, and a normal mode in a register unit; and cutting an output of scan out data to the test access port controller and an input of scan in data from a data register unit based on the information set in the register unit and controlling a connection between a scan register unit and the data register unit, wherein each of the data register unit and the scan register unit includes data registers for the same number of chains to be scanned at the same time, data set in one data register of the data register unit is kept in all the data registers of the scan register unit in parallel and scanned in all the scan chains in a scan in of the broadcast mode at a time of controlling the scan register unit and the data register unit, and the data set in the data register of the data register unit is kept in the data register corresponding to the scan register unit and scanned in the corresponding scan chain, in a scan in of the parallel mode.

2. The scan control method according to claim 1, wherein a scan out is performed in the parallel mode, the data of each scan chain is collected at the same time by reading the data of each data register of the scan register unit, and the connection between the scan register unit and the data register unit is controlled so as to read out the data to the corresponding data register of the data register unit.

3. The scan control method according to claim 1, wherein at a time of controlling the scan register unit and the data register unit, the connection between the scan register unit and the data register unit is controlled so as to keep only the data set in one data register of the data register unit in each of the data registers of the scan register unit one by one and to scan all the scan chains one after another, in the normal mode.

4. The scan control method according to claim 1, further comprising:
    setting number of shifts in the register unit through the bus; and
    setting scan in data in the data register unit through the bus, wherein the scan in data set in the data register unit is shifted for the number of shifts set in the register unit.

5. A device having a test access port controller, connected with a bus, comprising:
    a register unit where information indicating one scan mode of a broadcast mode, a parallel mode, and a normal mode, is set;
    a data register unit where a scan in data is set;
    a scan register unit; and
    a scan chain rearrangement unit which cuts an output of scan out data to the test access port controller and an input of scan in data from the data register unit and controls a connection between the scan register unit and the data register unit, based on the information set in the register unit,
    wherein each of the data register unit and the scan register unit includes the data registers for the same number of chains to be scanned at the same time, and
    the scan chain rearrangement unit controls the connection between the scan register unit and the data register unit so that the data set in one data register of the data register unit is kept in all the data registers of the scan register unit in parallel and scanned in all the scan chains in the broadcast mode, and that the data set in the data register of the data register unit is kept in the corresponding data register of the scan register unit and scanned in the corresponding scan in chain in a scan in of the parallel mode.

6. The device according to claim 5, wherein
    the scan chain rearrangement unit performs a scan out in the parallel mode and controls the connection between the scan register unit and the data register unit so as to collect the data of each scan chain at the same time by reading the data of each data register of the scan register unit and to read out the data to the corresponding data register of the data register unit.

7. The device according to claim 5, wherein
    the scan chain rearrangement unit controls the connection between the scan register unit and the data register unit so as to keep only the data set in one data register of the data register unit in each data register of the scan register unit one by one and scan all the scan chains one after another, in the normal mode.

8. The device according to claim 5, wherein
    the number of shifts is set in the register unit,
    the scan in data is set in the data register unit, and
    the scan in data set in the data register unit is shifted for the number of shifts set in the register unit.

* * * * *